United States Patent
Chen et al.

(10) Patent No.: US 8,147,742 B2
(45) Date of Patent: Apr. 3, 2012

(54) LITHOGRAPHY PROCESSES USING PHASE CHANGE COMPOSITIONS

(75) Inventors: Wei Chen, Midland, MI (US); Brian Robert Harkness, Midland, MI (US); Joan Sudbury-Holtschlag, Auburn, MI (US); Lenin James Petroff, Bay City, MI (US)

(73) Assignee: Dow Corning Corporation, Midland, MI (US)

( * ) Notice: Subject to any disclaimer, the term of this patent is extended or adjusted under 35 U.S.C. 154(b) by 276 days.

(21) Appl. No.: 11/661,028

(22) PCT Filed: Sep. 23, 2005

(86) PCT No.: PCT/US2005/034044
§ 371 (c)(1),
(2), (4) Date: Feb. 23, 2007

(87) PCT Pub. No.: WO2006/041645
PCT Pub. Date: Apr. 20, 2006

(65) Prior Publication Data
US 2007/0290387 A1    Dec. 20, 2007

Related U.S. Application Data

(60) Provisional application No. 60/617,233, filed on Oct. 8, 2004.

(51) Int. Cl.
*B29C 33/70* (2006.01)
(52) U.S. Cl. .................. 264/317; 264/219; 264/225
(58) Field of Classification Search .................. 264/293, 264/225, 219, 317
See application file for complete search history.

(56) References Cited

U.S. PATENT DOCUMENTS

| | | | |
|---|---|---|---|
| 3,445,420 A | 5/1969 | Kookootsedes et al. | |
| 3,989,667 A | 11/1976 | Lee et al. | |
| 4,087,585 A | 5/1978 | Schulz et al. | |
| 4,584,361 A | 4/1986 | Janik et al. | |
| 4,663,397 A | 5/1987 | Morita et al. | |
| 5,036,117 A | 7/1991 | Chung et al. | |
| 5,194,649 A | 3/1993 | Okawa et al. | |
| 5,248,715 A | 9/1993 | Gray et al. | |
| 5,259,926 A | 11/1993 | Kuwabara et al. | |
| 5,380,527 A | 1/1995 | Legrow et al. | |
| 5,493,041 A * | 2/1996 | Biggs et al. | 556/453 |
| 5,512,131 A | 4/1996 | Kumar et al. | |
| 5,744,507 A | 4/1998 | Angell et al. | |
| 6,039,897 A | 3/2000 | Lochhead et al. | |
| 6,121,165 A | 9/2000 | Mackey et al. | |
| 6,169,142 B1 | 1/2001 | Nakano et al. | |
| 6,334,960 B1 | 1/2002 | Willson et al. | |
| 6,344,160 B1 * | 2/2002 | Holtzberg | 264/102 |
| 6,406,531 B1 | 6/2002 | Bui et al. | |
| 6,620,515 B2 * | 9/2003 | Feng et al. | 428/447 |
| 6,719,915 B2 | 4/2004 | Wilson et al. | |
| 6,872,439 B2 * | 3/2005 | Fearing et al. | 428/99 |
| 7,410,606 B2 * | 8/2008 | Appleby et al. | 264/219 |
| 2002/0130444 A1 * | 9/2002 | Hougham | 264/519 |
| 2003/0085488 A1 | 5/2003 | Newell et al. | |
| 2003/0194537 A1 | 10/2003 | Bhagwagar et al. | |
| 2003/0224186 A1 | 12/2003 | Feng et al. | |
| 2004/0163563 A1 | 8/2004 | Sreenivasan et al. | |
| 2005/0038180 A1 * | 2/2005 | Jeans | 524/588 |

FOREIGN PATENT DOCUMENTS

| | | |
|---|---|---|
| EP | 0 493 791 A1 | 7/1992 |
| EP | 0 497 349 B1 | 8/1992 |
| WO | WO 2004/054784 A1 | 7/2004 |

OTHER PUBLICATIONS http://dictionary.reference.com/browse/matrixDictionary.com.*
R. Grumping, 1999, Fresenius J Anal Chem, 363, 347-352.*
Xia, Younan and Whitesides, George M., "Soft Lithography," Angew. Chem., Int. Ed. 1998, vol. 37, pp. 550-575.
Chou, Stephen Y., Krauss, Peter R., and Renstrom, Preston J., "Imprint Lithography with 25-Nanometer Resolution," Science, vol. 272, pp. 85-87, Apr. 5, 1996.
Chou, Stephen Y., Krauss, Peter R., and Renstrom, Preston J., "Imprint of Sub-25 nm vias in tranches in polymers," Appl. Phys. Lett. 67(21), pp. 3114-3116, Nov. 20, 1995.
Chou, Stephen Y., Krauss, Peter R., and Renstrom, Preston J., "Nanoimprint Lithography," J. Vac. Sci. Technol. B 14(6), pp. 4129-4133, Nov./Dec. 1996.
Chou, Stephen Y., and Krauss, Peter R., "Imprint Lithography with Sub-10 nm Feature Size and High Throughput," Microelectronic Engineering 35 (1997), pp. 237-240.
Bailey, T., Choi, B.J., Colburn, et.al., "Step and Flash Imprint Lithography: Template Surface Treatment and Defect Analysis," J. Vac. Sci. Technol. B 18(6), pp. 3572-3577, Nov./Dec. 2000.
Kim, Youn Sang; Lee, Hong H.; Hammond, Paula T., "High density nanostructure transfer in soft molding using polyurethane actylate molds and polyelectrolyte multilayers," Nanotechnology 14 (2003), pp. 1140-1144.
Huck, Wilhelm T.S.; Yan, Lin; Stroock, Abe; Haag, Rainer; Whitesides, George M., "Patterned Polymer Multilayers as Etch Resists," American Chemical Society, 1999, 15, pp. 6862-6967.

* cited by examiner

*Primary Examiner* — Khanh P Nguyen
*Assistant Examiner* — Vishal I Patel
(74) *Attorney, Agent, or Firm* — Erika Takeuchi

(57) ABSTRACT

A lithography method includes the steps of: A) filling a mold having a patterned surface with a phase change composition at a temperature above the phase change temperature of the phase change composition; B) hardening the phase change composition to form a patterned feature; C) separating the mold and the patterned feature; optionally D) etching the patterned feature; optionally E) cleaning the mold; and optionally F) repeating steps A) to D) reusing the mold. The PCC may include an organofunctional silicone wax.

14 Claims, No Drawings

LITHOGRAPHY PROCESSES USING PHASE CHANGE COMPOSITIONS

CROSS REFERENCE

Cross Reference to Related Applications

This application is a U.S. national stage filing under 35 U.S.C. §371 of PCT Application No. PCT/US2005/034044 filed on 23 Sep. 2005, currently pending, which claims the benefit of U.S. Provisional Patent Application No. 60/617,233 filed 8 Oct. 2004 under 35 U.S.C. §119 (e). PCT Application No. PCT/US2005/034044 and U.S. Provisional Patent Application No. 60/617,233 are hereby incorporated by reference.

TECHNICAL FIELD

This invention relates to a lithography process using a phase change composition (PCC).

BACKGROUND

In a conventional lithography process, such as imprint molding, step and flash imprint molding, solvent assisted micromolding, microtransfer molding, and micromolding in capillaries, a mold with a pattern is placed on substrate. A layer of liquid is interposed by various methods between the patterned surface of the mold and the substrate. The liquid is then solidified by a cure or solvent removal processes. When the mold is removed, a patterned feature is left on the substrate.

These lithography processes for molding may suffer from various drawbacks. When the liquid is solidified by curing, e.g., by exposure to ultraviolet (UV) radiation, heat, or both, this may add steps and cost to the process. Certain applications may not be compatible with the UV radiation or heat required for curing. Furthermore, cured materials may be difficult to etch. When solvent must be removed, this also adds process steps and may create environmental concerns. Furthermore, solvent removal may cause dimensional change or undesirable bubbles to form in the media. Cured materials may also be difficult to remove, resulting in poor reworkability.

PROBLEM TO BE SOLVED

There is a need to provide compositions for use in lithography processes that reduce the problems associated with solvents and curable materials.

SOLUTION

PCCs are solids at low temperature i.e., temperature below the phase change temperature of the PCC, and fluid at high temperature, i.e., temperature above the phase change temperature of the PCC. In the melt state, the PCC may have viscosity as low as 40 centiPoise (cPs). PCCs may be used in lithography processes to reduce or eliminate the problems discussed above.

SUMMARY

This invention relates to a lithography method. The method comprises:

A) filling a mold having a patterned surface with a PCC at a temperature above the phase change temperature of the PCC;
B) hardening the PCC to form a patterned feature;
C) separating the mold and the patterned feature;
optionally D) etching the patterned feature;
optionally E) cleaning the mold; and
optionally F) repeating steps A) to E) reusing the mold.

DETAILED DESCRIPTION

All amounts, ratios, and percentages are by weight unless otherwise indicated. The following is a list of definitions, as used herein.
Definitions and Usage of Terms
  "A" and "an" each mean one or more.
  "Combination" means two or more items put together by any method.
  "Organofunctional silicone wax" means a material having at least one $\equiv$Si—O—Si$\equiv$ linkage and having at least one organic waxy group bonded to Si.
  "Phase change temperature" means a temperature or temperature range evidencing a transition from a solid, crystalline, or glassy phase to a flowable phase, which can be characterized as exhibiting intermolecular chain rotation.
  "Siloxane" and "silicone" are used synonymously herein.
  "Substituted" means that one or more hydrogen atoms in a hydrocarbon group have been replaced with other atoms or groups. Suitable substituents are exemplified by, but not limited to, halogen atoms such as chlorine, fluorine, and iodine; halogen atom-containing groups; oxygen atom containing groups, such as carboxyfunctional groups, alkoxyfunctional groups, and (meth)acrylic functional groups; and nitrogen atom containing groups, such as cyanofunctional groups, and aminofunctional groups.
Lithography Methods For lithography methods, a mold may be prepared, for example, by replica molding, in which a curable silicone composition is cast against a master that has a patterned relief structure on its surface. An example of a curable silicone composition suitable for this purpose is SYLGARD® 184, which is commercially available from Dow Corning Corporation of Midland, Mich., U.S.A. The curable silicone composition is then cured and removed from the master. Alternatively, other molds such as metal, organic, or glass molds may also be used.

The method of this invention comprises:
A) filling a mold having a patterned surface with a PCC at a temperature above the phase change temperature of the PCC;
B) hardening the PCC to form a patterned feature;
C) separating the mold and the patterned feature;
optionally D) etching the patterned feature;
optionally E) cleaning the mold; and
optionally F) repeating steps A) to E) reusing the mold.
The method may optionally further comprise:
  I) casting a curable silicone composition against a master,
  II) curing the curable silicone composition to form the mold, and
  III) removing the mold from the master before step A).

Step A) may be performed by various methods. For example, step A) may be performed by contacting the patterned surface of the mold with a substrate, such that patterned structures in the patterned surface form a network of empty channels. When the PCC is heated above its phase change temperature and placed at open ends of the network, capillary action fills the channels with the PCC. Alternatively, the PCC may be applied to the patterned surface of the mold before contacting the patterned surface of the mold with a substrate and before or after heating the PCC to the temperature above its phase change temperature. Alternatively, the PCC may be applied to a surface of a substrate before the patterned surface of the mold is contacted with the substrate and before or after heating the PCC.

Step B) may be performed by cooling the PCC to a temperature below the phase change temperature of the PCC. When the phase change temperature of the PCC is at or above room temperature, the PCC may be cooled by any convenient means such as exposing the product of step A) to ambient air.

Step C) may be performed by any convenient means such as removing the mold from the patterned feature by, for example, manually peeling the mold off the patterned feature or automatically using, for example, a micromolding tool from SUSS MicroTec, Inc. of Indianapolis, Ind. 46204, U.S.A.

Step D) may be performed by techniques known in the art, for example, reactive ion etching or wet etching. In some lithography techniques, such as imprint molding, solid may form on a substrate in undesired areas during step B). Etching may be used to remove this excess solid, or to remove layers under the excess solid, or both.

Step E) may be performed by any convenient technique, such as rinsing the mold with solvent.

This invention may be used in various lithography techniques. Examples of such lithography techniques include, but are not limited to, imprint molding, step and flash imprint molding, solvent assisted micromolding (SAMIM), microtransfer molding, and micromolding in capillaries (MIMIC).

This invention may be used for imprint molding. In this lithography process, the PCC is applied on a surface of a substrate. The PCC may be heated above its phase change temperature before or after application to the surface of the substrate. The patterned surface of the mold is brought into contact with the surface of the substrate on which the PCC is applied, thereby distributing the PCC in the mold. The PCC is then hardened to a solid, and the mold is removed. Imprint molding may be used to prepare, for example, photodetectors and quantum-wire, quantum-dot, and ring transistors.

This invention may also be used in SAMIM. In this lithography process, the PCC is applied on a surface of a substrate. The PCC may be heated above its phase change temperature before or after application to the surface of the substrate. A patterned surface of a mold is wetted with a solvent and is brought into contact with the surface on which the PCC is applied. The choice of solvent depends on various factors including the specific mold and PCC selected; the solvent should not swell the mold. The PCC is then hardened to a solid, and the mold is removed.

This invention may be used in microtransfer molding, in which a PCC is applied to the patterned surface of the mold, either before or after heating the PCC above its phase change temperature. If any excess PCC is present, it may be removed, for example, by scraping with a flat block or by blowing with stream of inert gas. The resulting filled mold may be contacted with a substrate. The PCC is then hardened to a solid, and the mold may be peeled away to leave a patterned feature on the substrate. Microtransfer molding may be used to fabricate, for example, optical waveguides, couplers, and interferometers.

This invention may also be used for MIMIC. In this lithography method, the patterned surface of the mold is contacted with a surface of a substrate. The patterned structures in the mold form a network of empty channels. When the PCC is heated above its phase change temperature and placed at open ends of the network, capillary action fills the channels with the PCC. The PCC is then hardened to a solid, and the mold is removed.

Applications

The lithography method of this invention may be used in applications such as flat panel display fabrication, semiconductor fabrication, and electronic device packaging. The lithography method of this invention may also be used during fabrication of optical elements such as waveguides. The lithography method of this invention may also be used in applications such as biosensor fabrication, biochip device fabrication, and textured surface fabrication.

PCC

The PCC may comprise an organic wax; such as an animal or vegetable wax such as beeswax, carnauba, spermaceti, lanolin, shellac wax, candelilla, and combinations thereof; a petroleum-based wax such as paraffin, petrolatum, microcrystalline, and combinations thereof; an earth wax such as white ceresine, yellow ceresine, white ozokerite, and combinations thereof; or a synthetic wax such as a Fischer Tropsh wax, an ethylenic polymer such as polyethylene wax, chlorinated naphthalene wax, and combinations thereof. Suitable organic waxes are known in the art and commercially available, see for example, U.S. Pat. No. 6,121,165, col. 11, lines 33-65.

Alternatively, PCCs comprising silicone matrices can be used to form a patterned feature in a lithography process described above. Suitable silicone matrices may comprise an organofunctional silicone wax. Organofunctional silicone waxes are known in the art and commercially available. The PCC may comprise an uncrosslinked organofunctional silicone wax, a crosslinked organofunctional silicone wax, or a combination thereof. Alternatively, a combination of an organic wax and an organofunctional silicone wax may be used in the PCC. Suitable uncrosslinked and crosslinked organofunctional silicone waxes are known in the art, see for example, U.S. Pat. No. 6,121,165 at col. 21, line 24 to col. 24, line 24.

Uncrosslinked organofunctional silicone waxes may have the formula:

$$R^2R^3{}_2SiO(R^3R^4SiO)_x(R^3{}_2SiO)_y(R^3R^1SiO)_zSiR^3{}_2R^2.$$

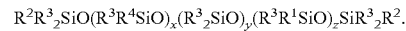

Each $R^1$ is independently an organic waxy group such as a substituted or unsubstituted monovalent hydrocarbon group of at least 16 carbon atoms, alternatively at least 20 carbon atoms, alternatively at least 24 carbon atoms, and alternatively at least 26 carbon atoms. The maximum number of carbon atoms is not specifically restricted and may be 30 carbon atoms or higher. $R^1$ has a number of carbon atoms sufficient to impart crystallinity to the matrix.

As described in U.S. Pat. No. 5,380,527 (col. 3, lines 10-57), the uncrosslinked organofunctional silicone wax can be prepared by reacting a commercially available organosiloxane having silicon-bonded hydrogen atoms (such as trimethylsiloxy-terminated, dimethyl, methyl hydrogen siloxane) with a slight stoichiometric excess of an olefin in the presence of a transition metal (e.g., platinum) catalyst. The number of carbon atoms in the olefin will determine the number of carbon atoms in $R^1$. Olefins are known in the art and commercially available. Mixtures of olefins having different numbers of carbon atoms can be used, for example mixtures of olefins having 30 carbon atoms and olefins having greater than 30 carbon atoms can be used to prepare the uncrosslinked organofunctional silicone wax. For example, the olefin can be GULFTENE® C30+ or GULFTENE® C24/C28, which are mixtures of olefins commercially available from Chevron Phillips Chemical Co., U.S.A. GULFTENE® C30+ comprises a mixture of branched and linear 1-alkenes having 24 to 54 carbon atoms, with an average of 34 carbon atoms. GULFTENE® C24/28 comprises a mixture of 1-alkenes having 24 to 28 carbon atoms. The olefin can comprise a mixture of 1-triacontene, 1-dotriacontene, 1-hexacosene, 1-octacosene, 1-tetratriacontene, and alpha-alkenes having greater than 10 carbon atoms. The olefin can comprise a mixture of 1-triacontene, 1-alkenes having 24 to 28 carbon atoms, and 2-ethyl-tetracosene. When a mixture of olefins is used, different instances of $R^1$ will have differing numbers of carbon atoms. The olefin or mixture of olefins can be selected to provide $R^1$ groups of a desired number of carbon atoms. One skilled in the art would be able to prepare uncrosslinked organofunctional siloxane waxes without undue experimentation.

The monovalent hydrocarbon group for $R^1$ may be branched or unbranched, saturated or unsaturated, and unsubstituted. Alternatively, the monovalent hydrocarbon group for $R^1$ can be unbranched, saturated, and unsubstituted.

$R^1$ is exemplified by $C_{20}H_{41}$, $C_{21}H_{43}$, $C_{22}H_{45}$, $C_{23}H_{47}$, $C_{24}H_{49}$, $C_{25}H_{51}$, $C_{26}H_{53}$, $C_{27}H_{55}$, $C_{28}H_{57}$, $C_{29}H_{59}$, $C_{30}H_{61}$, $C_{31}H_{63}$, $C_{32}H_{65}$, $C_{33}H_{67}$, $C_{34}H_{69}$, $C_{35}H_{71}$, $C_{36}H_{73}$, $C_{37}H_{75}$, $C_{38}H_{77}$, $C_{39}H_{79}$, $C_{40}H_{81}$, and a combination thereof. Alternatively, $R^1$ can be eicosyl, heneicosyl, docosyl, tricosyl, tetracosyl, pentacosyl, hexacosyl, heptacosyl, octacosyl, nonacosyl, triacontyl, hentriacontyl, dotriacontyl, tritriacontyl, tetracontyl, pentacontyl, hexacontyl, heptacontyl, octacontyl, nonacontyl, hectacontyl, or a combination thereof. Alternatively, $R^1$ can be $C_{20}H_{41}$, $C_{22}H_{45}$, $C_{24}H_{49}$, $C_{26}H_{53}$, $C_{28}H_{57}$, $C_{30}H_{61}$, $C_{32}H_{65}$, $C_{34}H_{69}$, $C_{36}H_{73}$, $C_{38}H_{77}$, $C_{40}H_{81}$, or a combination thereof. Alternatively, $R^1$ can be eicosyl, docosyl, tetracosyl, hexacosyl, octacosyl, triacontyl, dotriacontyl, tetracontyl, pentacontyl, hexacontyl, heptacontyl, octacontyl, nonacontyl, hectacontyl, or a combination thereof.

Without wishing to be bound by theory, it is thought that the number of carbon atoms in $R^1$ will affect the phase change temperature of the PCC. Generally, the higher the number of carbon atoms, the higher the phase change temperature. To formulate a PCC with a phase change temperature of 60° C. or higher, it is thought that at least a portion of the $R^1$ groups in the organofunctional silicone wax have at least 20 carbon atoms. To formulate a PCC with a phase change temperature of 75° C. or higher, it is thought that at least a portion of the $R^1$ groups in the organofunctional silicone wax have at least 30 carbon atoms. For example, a PCC made with GULFTENE® C30+ can have a phase change temperature of 75° C.

Each $R^2$ is independently an organic group such as a substituted or unsubstituted monovalent hydrocarbon group of at least 1 carbon atom. $R^2$ can be the same as $R^1$ or $R^3$. The monovalent hydrocarbon group for $R^2$ may be branched or unbranched, saturated, and unsubstituted. Alternatively, the monovalent hydrocarbon group for $R^2$ can be unbranched, saturated, and unsubstituted. $R^2$ is exemplified by substituted and unsubstituted alkyl groups, substituted and unsubstituted aromatic groups, and a combination thereof. $R^2$ can be an unsubstituted alkyl group such as methyl, ethyl, propyl, or butyl.

Each $R^3$ is independently an organic group such as a substituted or unsubstituted monovalent hydrocarbon group of 1 to 10 carbon atoms. $R^3$ can be branched, unbranched, or cyclic. Cyclic groups for $R^3$ include phenyl groups, styryl, and 2-phenylpropyl groups. The monovalent hydrocarbon group for $R^3$ may be branched or unbranched, saturated or unsaturated, and unsubstituted. Alternatively, the monovalent hydrocarbon group for $R^3$ can be unbranched, saturated, and unsubstituted. $R^3$ can be an unsubstituted alkyl group such as methyl, ethyl, propyl, or butyl.

Each $R^4$ is independently an organic group. Each $R^4$ may be a monovalent hydrocarbon group of 1 to 10 carbon atoms, as described above for $R^3$. Alternatively, each $R^4$ may be polyoxyalkylene group, such as a group of the formula: —$(CH_2)_a(CH_2CH_2O)_b(CH(CH_3)CH_2O)_cR^7$, where a has a value ranging from 0 to 40, b has a value ranging from 0 to 40, and c has a value ranging from 0 to 40, with the proviso that at least one of b and c is greater than 0. $R^7$ is a terminal group. $R^7$ may be a hydrogen atom, an alkyl group, or an acyl group.

In the formula above, x has a value ranging from 0 to 600, y has a value ranging from 0 to 200, and z has a value ranging from 1 to 200. Without wishing to be bound by theory, it is thought that the values of x, y and z will affect the viscosity of the PCC.

In the formula above, each $R^1$ can independently be a monovalent hydrocarbon group of at least 16 carbon atoms, alternatively at least 24 carbon atoms, each $R^2$ can be a methyl group, and each $R^3$ can be a methyl group. The uncrosslinked organofunctional silicone wax can comprise $(CH_3)_3SiO((CH_3)_2SiO)_3((CH_3)C_{24}H_{49}SiO)_5Si(CH_3)_3$, $(CH_3)_3SiO((CH_3)_2SiO)_{70}((CH_3)C_{30}H_{61}SiO)_{30}Si(CH_3)_3$, $(CH_3)_3SiO[(CH_3)(C_{30}H_{61})SiO]_8Si(CH_3)_3$,

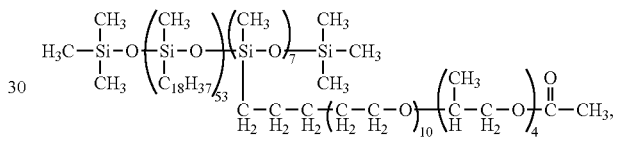

or a combination thereof.

Uncrosslinked silicone waxes may be cyclic. Suitable cyclic uncrosslinked organofunctional silicone waxes can have the formula: $(R^3{}_2SiO)_m(R^3R^1SiO)_n$, where $R^1$ and $R^3$ are as described above. In this formula, m has a value greater than or equal to 0, n has a value greater than or equal to 1; with the proviso that m+n has a value ranging from 1 to 8, alternatively 3 to 6. A combination of a cyclic uncrosslinked silicone wax and a noncyclic uncrosslinked silicone wax may be used in the PCC.

The PCC may comprise a crosslinked organofunctional silicone wax. Without wishing to be bound by theory, it is thought that the crosslinked organofactional silicone wax may affect the rheology of the PCC. The crosslinked organofunctional silicone wax may comprise a reaction product of a siloxane having silicon-bonded hydrogen atoms or an organosiloxane having silicon-bonded hydrogen atoms, an alpha-olefin, and a crosslinker, in the presence of a transition metal catalyst. Crosslinked organofunctional waxes are known in the art and commercially available. Alternatively, the crosslinked organofunctional silicone wax may comprise a reaction product of a siloxane having silicon-bonded hydrogen atoms or an organosiloxane having silicon-bonded hydrogen atoms, a crosslinker, an alpha-olefin, and a polyoxyalkylene.

U.S. Pat. No. 5,493,041 discloses crosslinked organofunctional siloxane waxes and methods for their preparation. For example, the crosslinked organofunctional silicone wax may be prepared by reacting a commercially available siloxane having silicon-bonded hydrogen atoms with a slight stoichiometric excess of an olefin and an unconjugated alpha, omega-diene crosslinker in the presence of a transition metal (e.g., platinum) catalyst. Olefins are known in the art and commercially available. Mixtures of olefins having different numbers of carbon atoms can be used, for example mixtures of olefins having 30 carbon atoms and olefins having greater than 30 carbon atoms can be used to prepare the crosslinked organofunctional silicone wax. The crosslinker can be an organic group, an organosilicone having an average of at least two alkenyl groups bonded to silicon atoms per molecule, a combination thereof, and others. U.S. Pat. No. 6,121,165 discloses alternative crosslinked organofunctional silicone waxes and methods for their preparation. One skilled in the art would be able to prepare crosslinked organofunctional siloxane waxes without undue experimentation.

Suitable crosslinked organofunctional silicone waxes may have the following unit formula.

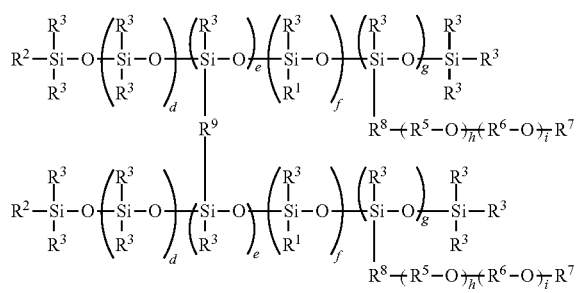

$R^1$, $R^2$, and $R^3$ are as described above. Each $R^5$ is independently an alkyl group of 2 to 4 carbon atoms. Each $R^6$ is independently an alkyl group of 2 to 6 carbon atoms. Each $R^7$ is a terminal group as described above, for example acyl groups of 1 to 20 carbon atoms, alkyl groups of 1 to 10 carbon atoms, or a hydrogen atom. Each $R^8$ is independently a divalent organic group or nil (i.e., when $R^8$ is nil, the silicon atom is bonded directly to $R^5$). Each $R^9$ is a divalent siloxane group, a divalent organic group, or a combination thereof. Each d independently has a value greater than or equal to 0; each e independently has a value greater than 0; each f independently has a value greater than 0; each g independently has a value greater than or equal to 0; each h independently has a value greater than or equal to 0; and each i independently has a value greater than 0, with the proviso that at least one of h or i has a value greater than 0.

Each $R^5$ and each $R^6$ may be ethyl, propyl, or butyl. Alternatively, each $R^5$ is ethyl. Alternatively, each $R^6$ is propyl. Each $R^7$ may be an acyl group. Each $R^8$ may be independently a divalent hydrocarbon group such as ethylene or propylene. Each $R^9$ may be a divalent polydiorganosiloxane such as divalent polydimethylsiloxane of the formula: —O—$(CH_3)_2$SiOSi$(CH_3)_2$—O—. Alternatively, each $R^9$ may be a divalent organic group, such as a divalent hydrocarbon group exemplified by ethylene, propylene, and 1,5-hexadiene. Alternatively, each $R^9$ may be a combination of a divalent siloxane group and a divalent organic group. For example, each $R^9$ may be a combination of two ethylene groups and a polydimethylsiloxane group, the combination having the formula:

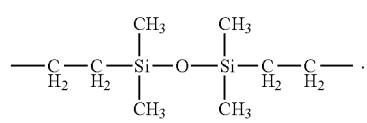

Each d may have a value ranging from 0 to 600. Each e may have a value ranging from 0 to 5, alternatively 0 to 0.2. Each f may have a value ranging from 1 to 100. Each g may have a value ranging from 1 to 100. Each h may have a value ranging from 0 to 40, and each i may have a value ranging from 0 to 40, with the proviso that at least one of h or i is greater than 0.

Examples of suitable crosslinked organofunctional silicone waxes include a wax of the formula:

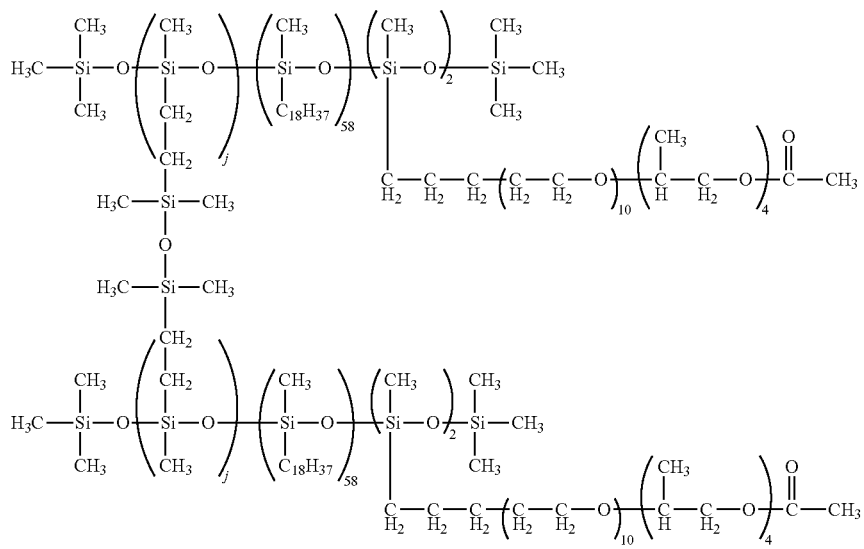

where each j is 0.2.

The PCC may further comprise an optional component selected from the group consisting of an adhesion promoter, a catalyst inhibitor, a pigment, a spacer, a wetting agent, a release agent, a rheology modifier, a conductive filler, a magnetic material, and a combination thereof.

Adhesion Promoter

An adhesion promoter may be added to the PCC in an amount of 0.01 to 50 weight parts based on the weight of the PCC. The adhesion promoter may comprise a transition metal chelate, an alkoxysilane, a combination of an alkoxysilane and a hydroxy-functional polyorganosiloxane, or a combination thereof.

The adhesion promoter can be an unsaturated or epoxy-functional compound. Suitable epoxy-functional compounds are known in the art and commercially available, see for example, U.S. Pat. Nos. 4,087,585; 5,194,649; 5,248,715; and 5,744,507 col. 4-5. The adhesion promoter may comprise an unsaturated or epoxy-functional alkoxysilane. For example, the functional alkoxysilane can have the formula $R^{10}_{\mu}Si(OR^{11})_{(4-\mu)}$, where $\mu$ is 1, 2, or 3, alternatively $\mu$ is 1.

Each $R^{10}$ is independently a monovalent organic group with the proviso that at least one $R^{10}$ is an unsaturated organic group or an epoxy-functional organic group. Epoxy-functional organic groups for $R^{10}$ are exemplified by 3-glycidoxypropyl and (epoxycyclohexyl)ethyl. Unsaturated organic groups for $R^{10}$ are exemplified by 3-methacryloyloxypropyl, 3-acryloyloxypropyl, and unsaturated monovalent hydrocarbon groups such as vinyl, allyl, hexenyl, undecylenyl.

Each $R^{11}$ is independently an unsubstituted, saturated hydrocarbon group of at least 1 carbon atom. $R^{11}$ may have up to 4 carbon atoms, alternatively up to 2 carbon atoms. $R^{11}$ is exemplified by methyl, ethyl, propyl, and butyl.

Examples of suitable epoxy-functional alkoxysilanes include 3-glycidoxypropyltrimethoxysilane, 3-glycidoxypropyltriethoxysilane, (epoxycyclohexyl)ethyldimethoxysilane, (epoxycyclohexyl)ethyldiethoxysilane and combinations thereof. Examples of suitable unsaturated alkoxysilanes include vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, and combinations thereof.

The adhesion promoter may comprise an epoxy-functional siloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane. The adhesion promoter may comprise a combination of an epoxy-functional alkoxysilane and an epoxy-functional siloxane. For example, the adhesion promoter is exemplified by a mixture of 3-glycidoxypropyltrimethoxysilane and a reaction product of hydroxy-terminated methylvinylsiloxane with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methyvinyl/dimethylsiloxane copolymer.

Suitable transition metal chelates include titanates, zirconates such as zirconium acetylacetonate, aluminum chelates such as aluminum acetylacetonate, and combinations thereof. Transition metal chelates and methods for their preparation are known in the art, see for example, U.S. Pat. No. 5,248,715, EP 0 493 791 A1, and EP 0 497 349 B1.

Catalyst Inhibitor

A catalyst inhibitor may be added to the PCC to prevent crosslinking of uncrosslinked organofunctional silicone waxes or to prevent further crosslinking of crosslinked organofunctional silicone waxes, particularly when a platinum group metal catalyst is used in the preparation of the organofunctional silicone wax. Suitable catalyst inhibitors are known in the art and are commercially available. The catalyst inhibitor is exemplified by acetylenic alcohols such as methyl butynol, ethynyl cyclohexanol, dimethyl hexynol, and combinations thereof; cycloalkenylsiloxanes such as methylvinylcyclosiloxanes exemplified by 1,3,5,7-tetramethyl-1,3,5,7-tetravinylcyclotetrasiloxane, 1,3,5,7-tetramethyl-1,3,5,7-tetrahexenylcyclotetrasiloxane, and combinations thereof; ene-yne compounds such as 3-methyl-3-penten-1-yne, 3,5-dimethyl-3-hexen-1-yne; triazoles such as benzotriazole; phosphines; mercaptans; hydrazines; amines such as tetramethyl ethylenediamine, dialkyl fumarates, dialkenyl fumarates, dialkoxyalkyl fumarates, maleates, and combinations thereof. Suitable catalyst inhibitors are disclosed by, for example, U.S. Pat. Nos. 3,445,420; 3,989,667; 4,584,361; and 5,036,117.

The amount of catalyst inhibitor that may be added to the composition will depend on various factors including the particular catalyst inhibitor used and the nature and amount of catalyst that may be present. However, the amount of catalyst inhibitor may be 0.001% to 10% based on the weight of the PCC.

Pigment

A pigment may optionally be added to the PCC. The exact amount of pigment added to the PCC depends on the type of pigment selected, however, the pigment may be added to the composition in an amount of 0.001% to 30% based on the weight of the PCC. Pigments are known in the art and commercially available. Suitable pigments include carbon blacks, such as LB-1011C carbon black from Williams, chromium oxide pigments, such as Harcros G-6099, titanium dioxides such as those available from DuPont, and UV-active dyes such as (thiophenediyl)bis(t-butylbenzoxazole) which is commercially available under the name UVITEX OB from Ciba Specialty Chemicals.

Spacer

A spacer may optionally be added to the PCC. Spacers can comprise organic particles, inorganic particles, or a combination thereof. Spacers can be thermally conductive, electrically conductive, or both. Spacers can have a particle size of 25 micrometers to 250 micrometers. Spacers can comprise monodisperse beads. The amount of spacer depends on various factors including the distribution of particles, pressure to be applied during placement of the PCC, and temperature of placement. The PCC may comprise up to 15%, alternatively up to 5% of spacer. One skilled in the art would recognize that the spacer may be added in addition to, or instead of, all or a portion of another optional ingredient such as particulate rheology modifier, conductive filler, or magnetic material.

Release Agent

Release agents may be fluorinated compounds, such as fluoro-functional silicones, or fluoro-functional organic compounds.

Rheology Modifier

Rheology modifiers may be added to change the thixotropic properties of the PCC. Rheology modifiers may be particulates or low viscosity siloxanes. Rheology modifiers are exemplified by flow control additives; reactive diluents; anti-settling agents; alpha-olefins; hydroxyl-terminated silicone-organic copolymers, including but not limited to hydroxyl-terminated polypropyleneoxide-dimethylsiloxane copolymers; and combinations thereof.

Conductive Filler

Conductive fillers (i.e., fillers that are thermally conductive, electrically conductive, or both) may also be added to the PCC. Suitable conductive fillers include metal particles, metal oxide particles, and a combination thereof. Suitable thermally conductive fillers are exemplified by aluminum nitride; aluminum oxide; barium titinate; beryllium oxide; boron nitride; diamond; graphite; magnesium oxide; metal particulate such as copper, gold, nickel, or silver; silicon carbide; tungsten carbide; zinc oxide, and a combination thereof.

Conductive fillers are known in the art and commercially available, see for example, U.S. Pat. No. 6,169,142 (col. 4, lines 7-33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company. Silver filler is commercially available from Metalor Technologies U.S.A. Corp. of Attleboro, Mass., U.S.A. Boron nitride filler is commercially available from Advanced Ceramics Corporation, Cleveland, Ohio, U.S.A.

A combination of thermally conductive fillers having differing particle sizes and different particle size distributions may be used. For example, it may be desirable to combine a first conductive filler having a larger average particle size with a second conductive filler having a smaller average particle size in a proportion meeting the closest packing theory distribution curve. This may improve packing efficiency and enhance heat transfer.

Magnetic Material

Magnetic materials include iron particles and cobalt particles.

EXAMPLES

These examples are intended to illustrate the invention to one skilled in the art and should not be interpreted as limiting the scope of the invention set forth in the claims.

Example 1

A PCC that is solid at room temperature and has a phase change temperature of 38° C. has a viscosity of 5 Poise at 45° C. The PCC is placed on a surface of a substrate at room temperature, and the substrate is then heated to 50° C. The PCC liquefies and spreads on the surface of the substrate. A PDMS mold is placed on top of the liquified PCC, and a cooling cycle is started. The PCC has the formula:

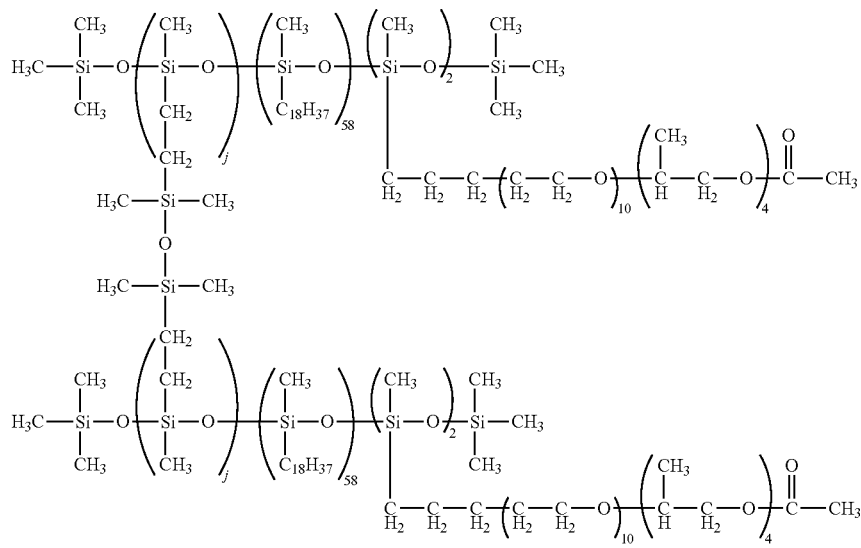

where j is 0.2.

After cooling to room temperature, the PCC solidifies and the mold is removed, revealing a patterned feature having dimensions on the order of 5 micrometers on the surface of the substrate. The substrate is a silicon wafer.

Example 2

Example 1 is repeated except that the PCC is an organofunctional silicone wax of the formula $(CH_3)_3SiO[(CH_3)(C_{30}H_{61})SiO]_8Si(CH_3)_3$, which has a phase change temperature of 70° C. and a viscosity of 170 cPs at 85° C. The substrate is heated to 80° C. Patterned features having dimensions on the order of 40 micrometers are formed on a silicon wafer.

INDUSTRIAL APPLICABILITY

With PCCs, such as those shown in Examples 1 and 2, the lithography process may be solvent-free or performed lower temperatures than conventional lithography processes, or both.

The invention claimed is:

1. A lithographic method comprising following steps:
   A) filling a mold having a patterned surface with a phase change composition at a temperature above a phase change temperature of the phase change composition, where the phase change composition is a solid below the phase change temperature and the phase change composition is a fluid above the phase change temperature; followed by step
   B) contacting the phase change composition with a substrate; followed by step
   C) hardening the phase change composition to form a patterned feature on the substrate by cooling the phase change composition to a temperature below the phase change temperature; followed by step
   D) separating the mold and the patterned feature; optionally followed by step
   E) etching the patterned feature; optionally followed by step
   F) removing the phase change composition; optionally followed by step
   G) cleaning the mold; and optionally followed by step H) repeating steps A) to G) reusing the mold; to obtain a patterned feature on the substrate, with the proviso that the phase change composition comprises an organofunctional silicone wax.

2. The method of claim 1, where the phase change composition comprises an uncrosslinked organofunctional silicone wax.

3. The method of claim 2, where the uncrosslinked organofunctional silicone wax comprises a wax selected from: $(R^3{}_2SiO)_m(R^3R^1SiO)_n$, $R^2R^3{}_2SiO(R^3R^4SiO)_x(R^3{}_2SiO)_y(R^3R^1SiO)_zSiR^3{}_2R^2$, or a combination thereof, where each $R^1$ is independently an organic waxy group, each $R^2$ is a substituted or unsubstituted monovalent hydrocarbon group having at least 1 carbon atom, each $R^3$ is independently a substituted or unsubstituted monovalent hydrocarbon group of 1 to 10 carbon atoms, each $R^4$ is independently $R^3$ or a polyoxyalkylene group, m has a value greater than or equal to 0, n has a value greater than or equal to 1, m+n has a value ranging from 1 to 8, x has a value ranging from 0 to 600, y has a value ranging from 0 to 200, and z has a value ranging from 1 to 200.

4. The method of claim 1, where the phase change composition comprises a crosslinked organofunctional silicone wax.

5. The method of claim 4, where the crosslinked organofunctional silicone wax has unit formula:

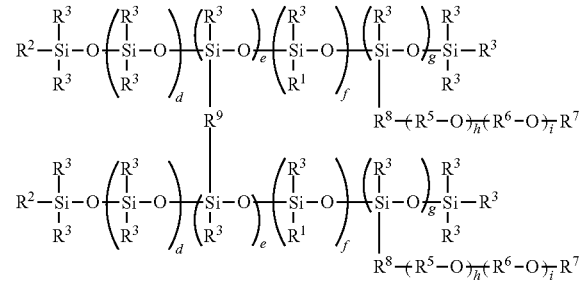

where each $R^1$ is independently an organic waxy group, each $R^2$ is independently a substituted or unsubstituted monovalent hydrocarbon group having at least 1 carbon atom, each $R^3$ is independently a substituted or unsubstituted monovalent hydrocarbon group of 1 to 10 carbon atoms, each $R^5$ is independently an alkyl group of 2 to 4 carbon atoms, each $R^6$ is independently an alkyl group of 2 to 6 carbon atoms, each $R^7$ is a terminal group selected from the group consisting of an acyl group, an alkyl group, and a hydrogen atom; each $R^8$ is independently a divalent organic group or nil, each $R^9$ is a divalent group, each d independently has a value greater than or equal to 0, each e independently has a value greater than 0, each f independently has a value greater than 0, each g independently has a value greater than or equal to 0, each h independently has a value greater than or equal to 0, and each i independently has a value greater than or equal to 0, with the proviso that at least one of h or i has a value greater than 0.

6. The method of claim 1, where the PCC comprises a combination of an organic wax and an organofunctional silicone wax.

7. The method of claim 1, further comprising:
I) casting a curable silicone composition against a master,
II) curing the curable silicone composition to form the mold, and
III) removing the mold from the master before step A).

8. The method of claim 1, where the method is used in a lithography technique selected from the group consisting of: imprint molding, step and flash imprint molding, solvent assisted micromolding, microtransfer molding, and micromolding in capillaries.

9. A patterned feature on a substrate prepared by a lithographic method comprising following steps:
A) filling a mold having a patterned surface with a phase change composition at a temperature above a phase change temperature of the phase change composition, where the phase change composition is a solid below the phase change temperature and the phase change composition is a fluid above the phase change temperature; followed by step
B) contacting the phase change composition with a substrate; followed by step
C) hardening the phase change composition to form a patterned feature on the substrate by cooling the phase change composition to a temperature below the phase change temperature; followed by step
D) separating the mold and the patterned feature; optionally followed by step
E) etching the patterned feature; optionally followed by step
F) removing the phase change composition; optionally followed by step
G) cleaning the mold; and optionally followed by step
H) repeating steps A) to G) reusing the mold;
to obtain a patterned feature on the substrate, with the proviso that the phase change composition comprises an organofunctional silicone wax and with the proviso that the patterned feature has dimensions on the order of 5 micrometers to 40 micrometers.

10. The patterned feature on a substrate according to claim 9, where the phase change composition comprises an uncrosslinked organofunctional silicone wax.

11. The patterned feature on a substrate according to claim 10, where the uncrosslinked organofunctional silicone wax comprises a wax selected from: $(R^3{}_2SiO)_m(R^3R^1SiO)_n$, $R^2R^3{}_2SiO(R^3R^4SiO)_x(R^3{}_2SiO)_y(R^3R^1SiO)_zSiR^3{}_2R^2$, or a combination thereof, where each $R^1$ is independently an organic waxy group, each $R^2$ is a substituted or unsubstituted monovalent hydrocarbon group having at least 1 carbon atom, each $R^3$ is independently a substituted or unsubstituted monovalent hydrocarbon group of 1 to 10 carbon atoms, each $R^4$ is independently $R^3$ or a polyoxyalkylene group, m has a value greater than or equal to 0, n has a value greater than or equal to 1, m+n has a value ranging from 1 to 8, x has a value ranging from 0 to 600, y has a value ranging from 0 to 200, and z has a value ranging from 1 to 200.

12. The patterned feature on a substrate according to claim 9, where the phase change composition comprises a crosslinked organofunctional silicone wax.

13. The patterned feature on a substrate according to claim 12, where the crosslinked organofunctional silicone wax has unit formula:

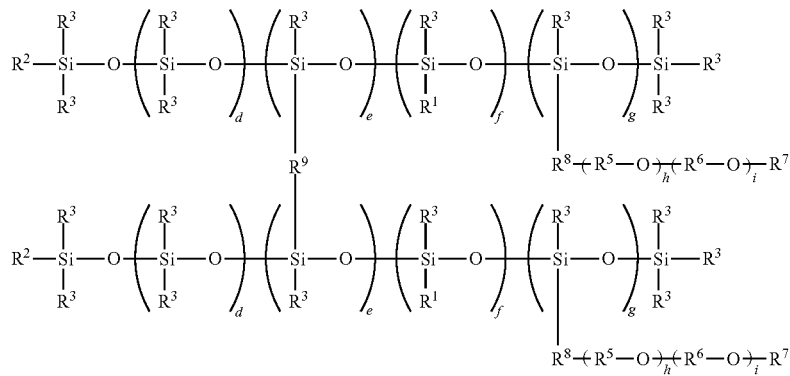

where each $R^1$ is independently an organic waxy group, each $R^2$ is independently a substituted or unsubstituted monovalent hydrocarbon group having at least 1 carbon atom, each $R^3$ is independently a substituted or unsubstituted monovalent hydrocarbon group of 1 to 10 carbon atoms, each $R^5$ is independently an alkyl group of 2 to 4 carbon atoms, each $R^6$ is independently an alkyl group of 2 to 6 carbon atoms, each $R^7$ is a terminal group selected from the group consisting of an acyl group, an alkyl group, and a hydrogen atom; each $R^8$ is independently a divalent organic group or nil, each $R^9$ is a divalent group, each d independently has a value greater than or equal to 0, each e independently has a value greater than 0, each f independently has a value greater than 0, each g independently has a value greater than or equal to 0, each h independently has a value greater than or equal to 0, and each i independently has a value greater than or equal to 0, with the proviso that at least one of h or i has a value greater than 0.

14. The patterned feature on a substrate according to claim 9, where the PCC further comprises an organic wax.

* * * * *